(12) United States Patent
Schmitt et al.

(10) Patent No.: US 6,331,801 B1
(45) Date of Patent: Dec. 18, 2001

(54) RF AMPLIFIER SYSTEM HAVING AN IMPROVED POWER SUPPLY

(75) Inventors: Philip Charles Schmitt; Ky Thoai Luu, both of Quincy, IL (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 09/545,023

(22) Filed: Apr. 7, 2000

(51) Int. Cl.[7] ........................................ H03F 3/38
(52) U.S. Cl. ................... 330/10; 330/124 R; 330/207 A
(58) Field of Search ................. 330/10, 124 R, 330/207 A, 251, 297

(56) References Cited

U.S. PATENT DOCUMENTS

| | | | |
|---|---|---|---|
| 4,580,111 | 4/1986 | Swanson | 332/41 |
| 5,838,193 | * 11/1998 | Myers et al. | 330/10 |
| 6,016,075 | * 1/2000 | Hamo | 330/10 |
| 6,107,875 | * 11/1998 | Pullen et al. | 330/10 |

* cited by examiner

Primary Examiner—Robert Pascal
Assistant Examiner—Henry Choe
(74) Attorney, Agent, or Firm—Tarolli, Sundheim, Cove, Tummino & Szabo L.L.P.

(57) ABSTRACT

An RF power amplifier system is provided having a DC voltage source for providing an input DC voltage. An RF source provides an RF cattier signal. An RF amplifier serves to amplifier the carrier signal. A DC to DC power supply provides operating voltage to the RF amplifier wherein the operating voltage exhibits a desired percentage of the input voltage. The DC to DC supply includes a low pass filter having a capacitor. A switching device is periodically turned on by turn on pulses for periodically applying the input voltage to the filter which then provides an output voltage across the capacitor. The output voltage serves as the operating voltage. A pulse generator provides the turn on pulses at a frequency synchronized to the frequency of the carrier signal. The turn on pulses exhibit a duty cycle that varies as a function of the value of a control signal. A comparator compares the input voltage with the output voltage and provides the control signal with a value that varies as a function of the comparison.

19 Claims, 4 Drawing Sheets

RF AMPLIFIER SYSTEM HAVING AN IMPROVED POWER SUPPLY

BACKGROUND OF THE INVENTION

1. Technical Field

This invention relates to the art of AM radio broadcasting and, more particularly, to an RF power amplifier system having an improved power supply.

2. Description of the Prior Art

The U.S. Patent to H. I. Swanson U.S. Pat. No. 4,580,111 discloses an amplitude modulator for use in AM radio broadcasting wherein the modulator serves to generate amplitude modulated signals by selectively turning on and off a plurality of RF amplifier modules to produce amplitude modulation. The amplifier modules include big step or unit step modules that each, when on, provide an amplified voltage based on the operating voltage supplied to the amplifier. This is a DC voltage obtained from rectifying a three phase AC input voltage. This big step or operating voltage may be referred to as a B+ voltage. Some of the amplifier modules in such a system are referred to as binary or fractional step amplifier modules, each when turned on providing an amplified output signal having a value which is a fraction of the unit or big step voltage.

In prior systems, the operating voltage for the binary amplifier modules was obtained from a binary power supply which utilized a separate single phase secondary winding tapped from the main three phase power transformer with suitable rectifying circuitry to create either a B+/2 or B+/4 operating voltage for the binary amplifier module. Some difficulty with such power supplies has been encountered. There is no adjustment of the DC voltage provided by the binary amplifier power supply and typically there is a tolerance of + or −5%. This has created an error in the fractional step level when compared with a full or big step. If a big step is on the order of 250V, then ½ step is expected to be on the order of 125V. A 5% error may result in a deviation of + or −10V from this anticipated ½ step level. It is desirable to reduce this error. External correction methods have been employed to adjust the size of the binary step relative to the big step. The methods employed have only allowed coarse adjustments and have not been able to remove all the error introduced by the windings of the power supply.

SUMMARY OF THE INVENTION

It is an object of the present invention to provide a DC to DC power supply for an RF power amplifier system wherein the supply does not employ additional transformer windings on the main three phase power supply transformer but, instead, provides a transformerless supply.

It is a still further object of the present invention to provide such a DC to DC power supply that employs a switching circuit wherein the switching is accomplished in synchronism with the AM carrier frequency.

It is a still further object of the present invention to provide such a supply wherein the output voltage tracks the input voltage so that variations in the value of the amplitude of the input voltage will be tracked so that the output voltage is always at essentially the same percentage of the input voltage.

It is another object of the present invention to provide such a DC to DC power supply which tracks the input voltage to maintain a desired ratio of input to output voltage while at the same time passing a proper ratio of AC line ripple.

In accordance with the present invention, an RF power amplifier system is provided having a DC voltage source for providing an input DC voltage. An RF source provides an RF carrier signal. An RF amplifier serves to amplify the carrier signal. A DC to DC power supply provides operating voltage to the RF amplifier wherein the operating voltage exhibits a desired percentage of the input voltage. The DC to DC supply includes a low pass filter having a capacitor. A switching device is periodically turned on by turn on pulses for periodically applying the input voltage to the filter which then provides an output voltage across the capacitor. The output voltage serves as the operating voltage. A pulse generator provides the turn on pulses at a frequency synchronized to the frequency of the carrier signal. The turn on pulses exhibit a duty cycle that varies as a function of the value of a control signal. A comparator compares the input voltage with the output voltage and provides the control signal with a value that varies as a function of the comparison.

BRIEF DESCRIPTION OF THE DRAWINGS

The foregoing and other objects and advantages of the present invention will become more readily apparent from the following description as taken in conjunction with the accompanying drawings, wherein.

DESCRIPTION OF PREFERRED EMBODIMENT

One application of the present invention is in conjunction with RF power amplifiers employed in an AM broadcast transmitter. An example of such a transmitter is presented in FIG. 1 to which attention is now directed.

Figure 1:
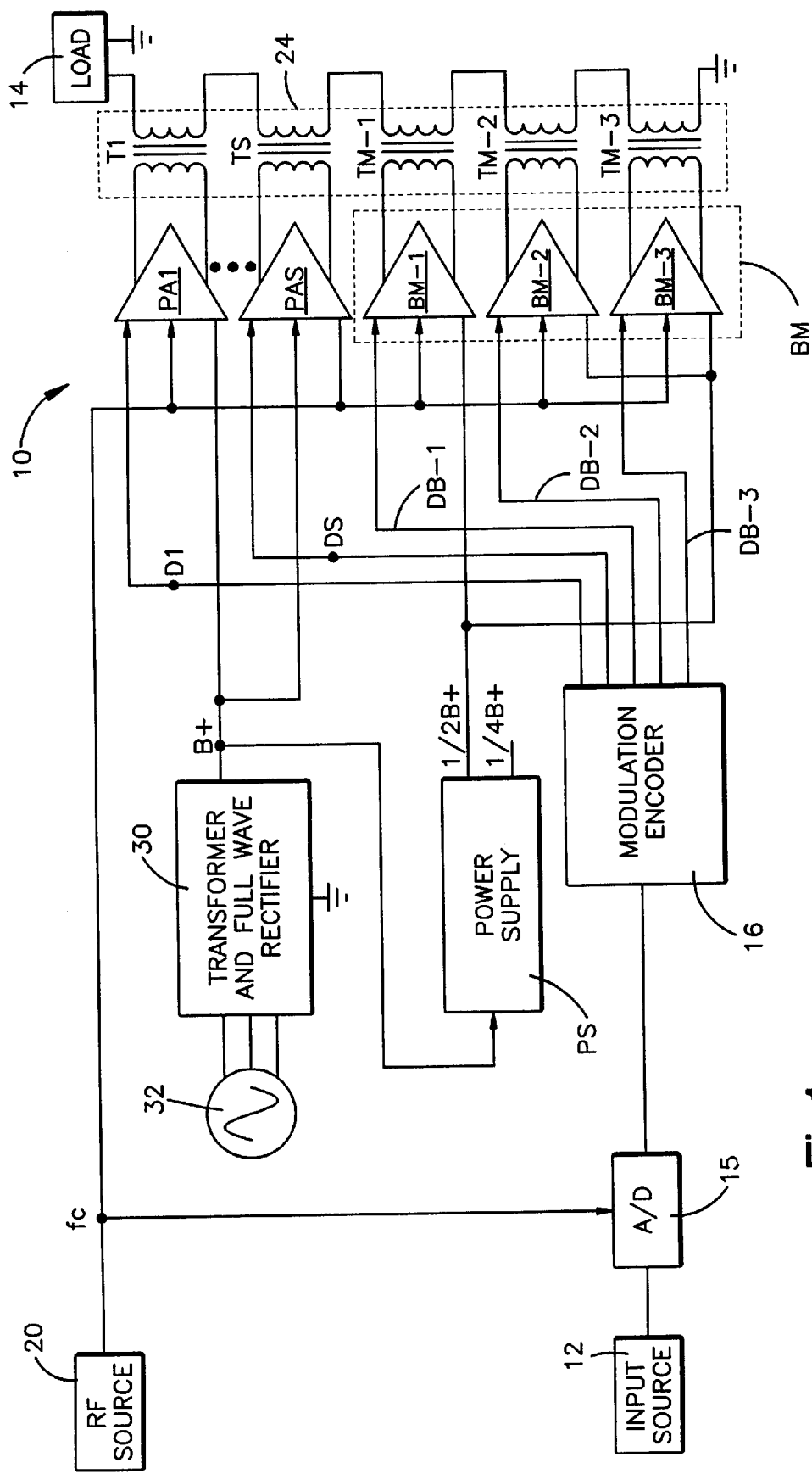
FIG. 1 is schematic-block diagram illustration of one application to which the present invention may be applied.

Referring now to FIG. 1, the amplitude modulator 10 is illustrated as receiving an input signal from input source 12 which may be the source of an audio signal. Modulator 10 generates an RF carrier signal which is amplitude modulated as a function of the amplitude of the input signal from source 12. The amplitude modulated carrier signal is provided to a load 14, which may take the form of an RF transmitting antenna. A modulation encoder 16 provides a plurality of digital control signals D1 through DS. The control signals are binary signals each having a binary 1 or a binary 0 level. The number of signals having binary 1 or binary 0 levels is dependent upon the instantaneous level of the input signal which is digitized by an analog to digital converter 15.

Each of the output control signals D1–DS is supplied to one of a plurality of S RF power amplifier modules $PA_1$–$PA_S$. The control signals serve to turn associated power amplifier modules either on or off Thus, if the control signal has a binary 0 level, then its associated amplifier module is inactive and no signal is provided at its output. However, if the control signal is of a binary 1 level, then the power amplifier module is active and an amplified carrier signal is provided at its output. Each power amplifier module has an input connected to a single common RF source 20. The carrier signal may be a squarewave. The amplified carrier signals are supplied to a combiner circuit 24 comprised of a plurality of transformers $T_1, T_2, \ldots, T_S$. The secondary windings act as an independent signal source, whereby the signals provided by the various transformers additively combine with one another to produce a combined signal which is supplied to the load 14. This combined signal has the same frequency as the RF signal supplied by the RF source 20, but the amplitude of the combined signal is modulated in accordance with the input signal supplied by the input source 12. A DC voltage, representative of the desired carrier level, is summed with the audio signal 12 at a summer 13. This carrier level provides a carrier signal output even when no modulation takes place.

Each of the power amplifiers $PA_1$ through $PA_S$ provides a big step or unit step voltage based on the B+ voltage supply obtained from a transformer and fullwave rectifier circuit 30 coupled to an AC three phase line source 32.

In addition to the big step power amplifiers $PA_1$ through $PA_S$ the system in FIG. 1 includes a binary module BM having three binary amplifiers BM-1, BM-2 and BM-3 each of which, when on, provides a fractional portion of a big step. These are turned on by binary turn on signals DB-1, DB-2 and DB-3 from modulation encoder 16. The binary module amplifiers BM-1, BM-2 and BM-3 may provide fractional steps. These fractional steps are added to the unit or big steps by combiner 24. In addition to transformers $T_1-T_S$, this system includes additional transformers TM-1 TM-2 and TM-3. The secondary windings of these transformers and those of the big step transformers are all connected in series to provide a combined signal to the load 14. The magnitude of the fractional steps is based on the applied operating voltage and the winding turn ratios of transformers TM-1, TM-2 and TM-3. These may provide fractional steps of, for example, ½, ¼ and ⅛ of a big step.

In the prior art, the power supply for the binary modules was obtained by an additional secondary winding on the main transformer providing the B+ voltage supply as an operating voltage for the unit step or big step power amplifiers $PA_1$ through $PA_S$.

In accordance with the present invention, the power supply for the binary module BM is obtained from a transformerless power supply PS which has an input voltage B+ and which provides an output voltage which is a desired ratio or fraction thereof, such as ½ B+. As will be brought out hereinafter, this power supply includes a switching transistor which is switched synchronously with the AM carrier frequency to minimize switching noise which might be generated due to switching at a non-synchronous frequency. Moreover, the output voltage of the power supply tracks the input voltage and maintains an exact ratio of input to output voltage while passing through the proper ratio of AC line ripple.

The DC to DC power supply PS is described herein with reference to a simplified block diagram in FIG. 2 and later with respect to the more detailed block diagram of FIG. 4. The example presented herein is for providing an output voltage which is ½ of that of the input voltage. Thus, the input voltage is B+ and the output voltage tracks the input voltage at a ratio of ½ to provide an output voltage of ½ B+. The power supply includes a switch 50 which is periodically turned on by turn on pulses from a pulse generator in a control circuit 52. Whenever the switch 50 is closed it supplies the B+ voltage to a low pass filter 54 which then provides the output voltage across a capacitor (not shown in FIG. 2—see capacitor C3 in FIG. 4). The control circuit 52 provides the turn on pulses at a frequency which is synchronized to the frequency of the carrier frequency $F_C$. The pulses supplied by the pulse generator control 52 exhibit a duty cycle that varies as a function of the value of a control signal obtained by comparing a sample of the input voltage and a sample of the output voltage and providing the control signal with a value that varies as a function of this comparison. The low pass filter 54 filters the switching frequency of the pulse with modulator waveform to produce the DC output voltage. The duty cycle will control the level of the output voltage by the following formula:

$$V_{OUT}=V_{IN}\cdot DC \qquad \text{Equation 1}$$

Where,
DC=positive duty cycle of the PWM waveform where the duty cycle is expressed as a ratio (%).

Figure 3:
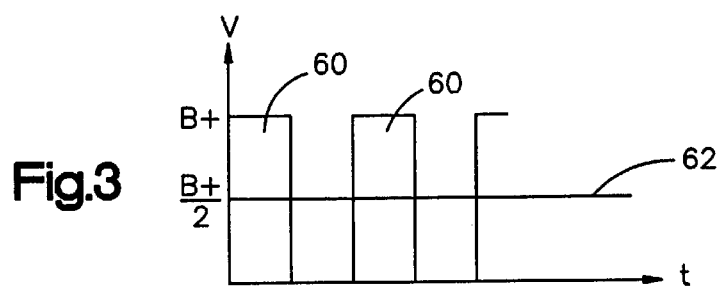
FIG. 3 is a graph of voltage verses time which is useful in describing the invention herein.

The control circuit 52 uses the carrier frequency to synchronize the switching frequency and eliminate additional switching noise that might take place due to switching at a non-synchronous frequency. The control circuit 52 adjusts the duty cycle to track the input voltage. This allows the output voltage to maintain the same voltage from full load to no load and under all conditions. The waveform in FIG. 3 summarizes the operation. Thus, the switch 50 is periodically turned on by pulses provided by the control circuit 52 at the duty cycle, as will be described hereinafter, to track the input voltage. The B+ pulses 60 are supplied to the low pass filter 54 and, after filtering the output voltage as represented by the waveform 62, there is provided a steady state output DC voltage with a value of B+/2.

Figure 2:
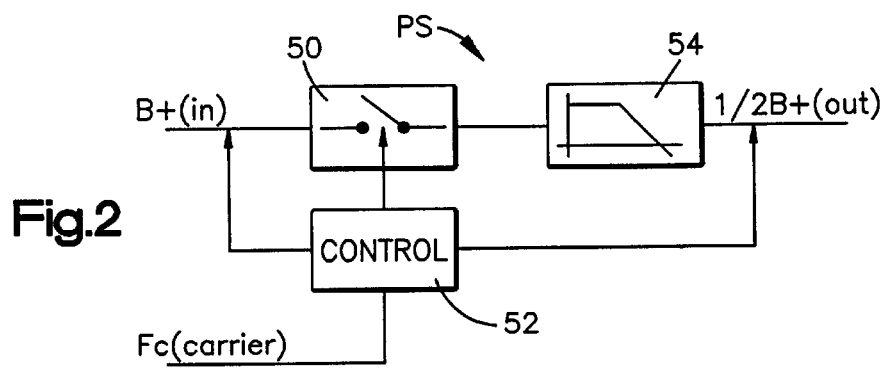
FIG. 2 is a simplified block diagram illustration of a power supply constructed in accordance with the present invention.
Figure 4:
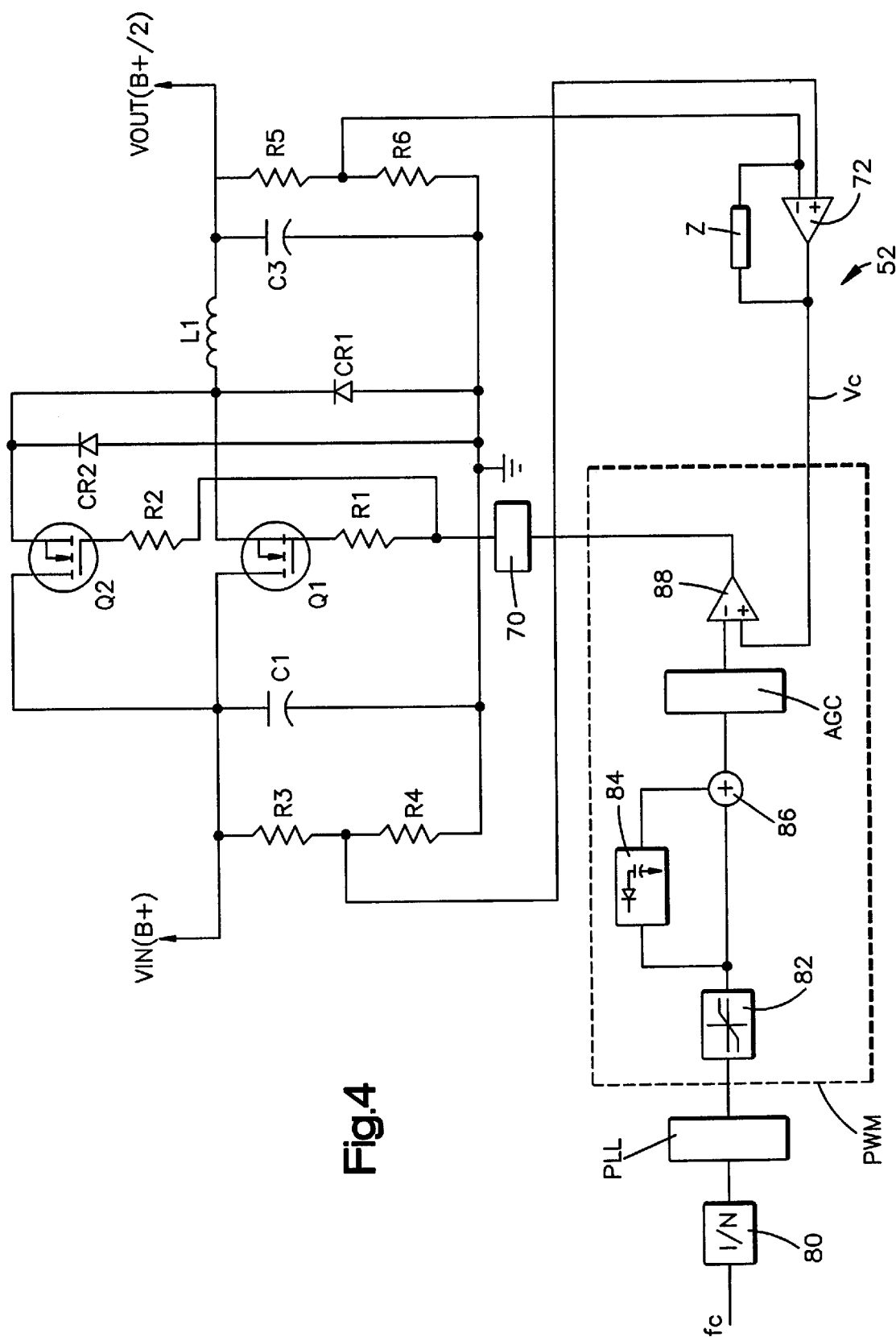
FIG. 4 is a schematic-block diagram illustration of a preferred embodiment of the invention.

Reference is now made to FIG. 4 which illustrates the power supply PS in greater detail than that of FIG. 2. The switch 50 of FIG. 2 takes the form of a MOSFET transistor Q1 together with a fast free wheeling diode CR1 and an isolated driver 70. The driver 70 serves to isolate the MOSFET circuit from the control circuit 52 since the former operates at voltages as high as 300 volts and the later operates at voltages on the order of 5 volts. The driver may take a suitable form such as an optical coupling network or a pulse transformer or the like. The free wheeling diode CR1 is provided to complete the DC circuit when the MOSFET transistor Q1 is not conducting. In the example presented herein, a second MOSFET Q2 is connected in parallel with MOSFET Q1 in order to provide sufficient drive current at higher voltages.

The low pass filter 54 in FIG. 2 is illustrated as including an inductor L1 and a capacitor C3. This filter is designed to filter the switching frequency but not effect the 50/60 Hz AC ripple. That is, the ripple frequency is passed by the filter.

Referring again to FIG. 4, the input voltage $V_{IN}$(B+) is supplied across a voltage divider comprised of resistors R3 and R4. An input filter C1 is connected across the voltage divider and supplies high frequency currents to the MOSFET transistors Q1 and Q2 as they switch. Resistors R1 and R2 in the gate circuits of transistors Q1 and Q2 provide drive signals from the driver 70. The output voltage V OUT (B+/2) is developed across a voltage divider including resistors R5 and R6. The voltage developed across resistor R4 is supplied to the positive input of a comparator amplifier 72 whereas the voltage obtained across resistor R6 is supplied to the negative input. Impedance Z is connected between the negative input and the output of amplifier 72. The operation of this amplifier will be described in greater detail hereinbelow.

The switching device (MOSFETS Q1 and Q2) are operated by a pulse width modulator PWM at a duty cycle sufficient to maintain a desired ratio of the input voltage to the output voltage. As will be brought out below this is accomplished with a variable duty cycle waveform resulting from a variable DC control signal. Also, as noted hereinbefore, it is desirable that the power supply PS operate in synchronism with the carrier frequency $F_C$ (or some division thereof). Consequently, the control circuit should operate at a frequency on the order of 100 kHz to 200 kHz (or any chosen frequency range that can be synchronous with the AM carrier frequency). The need for carrier synchronization is important because of the possibility that noise might be induced on the output spectrum if the switching frequency is other than being synchronous with the AM carrier frequency $F_C$.

A carrier input signal operating at a carrier frequency $F_C$ is received and is divided down by a number N by a divider 80. This takes the carrier frequency, in the range of 500 kHz to 1700 kHz, down to a range on the order of 100 to 250 kHz.

The divided down carrier frequency signal is then fed to a phase locked loop PLL. This circuit allows operation at the divided down carrier frequency even if the carrier signal is not present. That is, if the carrier signal is not present, the phase locked loop PLL will automatically default to a minimum frequency of approximately 80 kHz. This allows operation of the power supply PS even when the input carrier frequency is lost.

The output of the phase locked loop PLL is supplied to a pulse generator taking the form of a pulse width modulator PWM. The first stage of this circuit includes an integrator 82 that receives the divided down squarewave clock signal from the phase locked loop PLL and provides a triangular wave that linearly ramps up from a first level to a second level then down from the second level to the first level at a frequency corresponding with the divided down carrier frequency. This ramp signal is supplied to a peak detector 84 as well as to a summing circuit 86. The peak detector raises the ramp signal from the integrator so that the ramp signal is biased above zero volts for proper operation of the pulse width modulator PWM. In this example, the output ramp as obtained from the summing circuit 86 varies from a first level on the order of zero volts to a second level on the order of 5 volts and then down back to zero volts. The ramp is then supplied to an automatic gain control circuit AGC. This is used to accommodate amplitude fluctuations in the ramp waveform due to frequency. Thus, for example, at 100 kHz, the peak voltage of the ramp signal will be on the order of 5 volts. However, as the frequency increases to a higher level, such as 200 kHz, the peak voltage may only be 2.5 volts. In order to maintain the same resolution for the pulse width modulator comparator an automatic gain control circuit is used. This circuit automatically compensates for the variation in the input waveform and produces an output waveform of equal amplitude throughout the frequency range of operation (in this case 100 to 200 kHz).

The ramp signal from the automatic gain control circuit AGC is supplied to the negative input of the pulse width modulator comparator 88. A reference or control signal $V_C$ is supplied to the positive input of the comparator 88. The output of the comparator will change state whenever the ramp voltage goes above or below the control signal or reference voltage. This is illustrated in FIG. 5 to which attention is now directed.

Figure 5A:
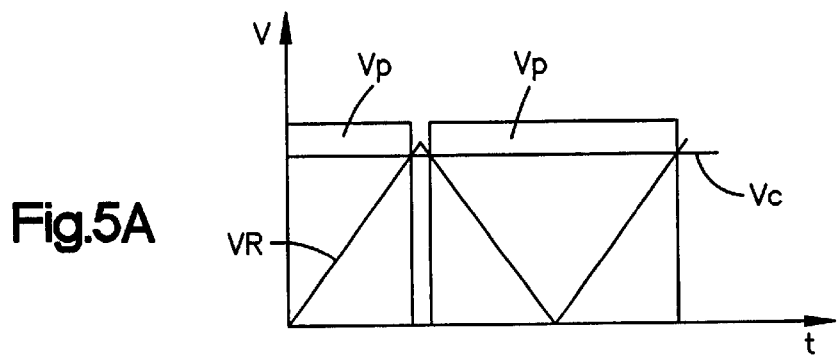
FIGS. 5A–5C present graphical waveforms of voltage with respect to time which are useful in describing the invention herein; and, FIG. 6 illustrates another embodiment of the invention.
Figure 5B:
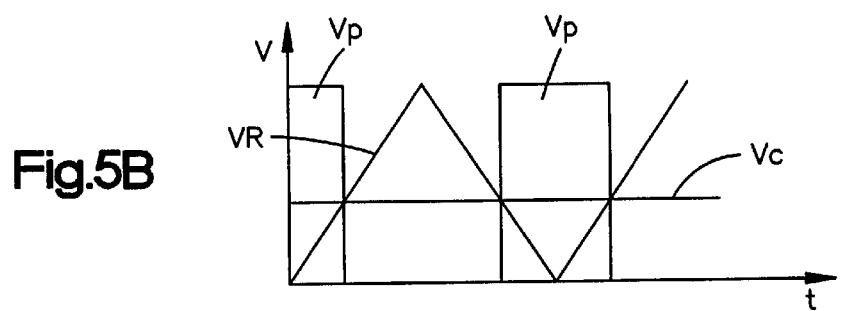
Figure 5C:
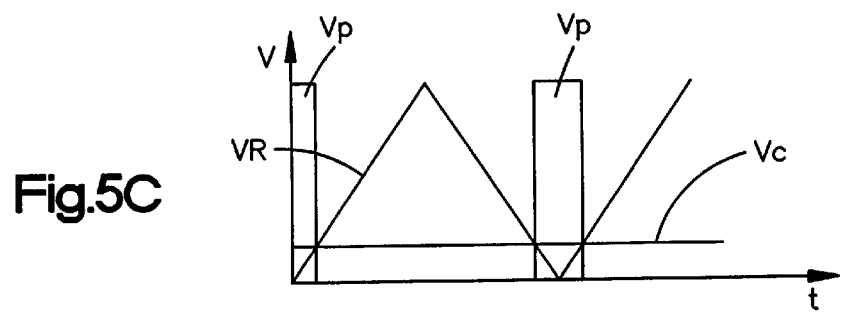

As shown in FIG. 5, the ramp voltage $V_R$ linearly increases to a maximum (about 5 volts) and then linearly decreases to a minimum (about zero volts) and this is repeated at the divided down carrier frequency. As shown in FIG. 5A, so long as the reference or control voltage $V_C$ is greater than the ramp voltage an output voltage pulse $V_P$ is provided. The output pulse $V_P$ has a pulse width which varies with the magnitude of the variable DC control or reference voltage $V_C$, as is noted by comparing FIGS. 5A, 5B and 5C. In FIG. 5A the control voltage $V_C$ is at a relatively high level resulting in a high duty cycle DC. In FIG. 5B the duty cycle DC is approximately 50%. In FIG. 5C at a relatively low control voltage $V_C$, the duty cycle DC is low. The variable width pulses $V_P$ act as the turn on pulses which when coupled through the drive 70 operate to turn on the MOSFET transistors Q1 and Q2. The turn on pulses are of variable width as the duty cycle is dependent upon the magnitude of the control voltage $V_C$.

The power supply PS needs to provide the desired fraction of the B+ voltage to the associated binary module BM as a fixed ratio of the input voltage whether the power supply has a load or has no load. When the power supply has no load, the capacitor C3 in the low pass filter acts as a peak detector and the voltage will rise as high as the input voltage. This is to be avoided. The problem noted is minimized by employing the error amplifier 72 having an impedance Z between its negative input and its output. This error amplifier provides a voltage equivalent to the error between the output voltage $V_{OUT}$ (B+/2) and the input voltage $V_{IN}$ (13+). The error voltage, sometimes referred to herein as the reference or control voltage $V_C$, is proportional to the difference in the voltages between the two. If the output voltage is too low, the error or control voltage $V_C$ will be higher and this will cause the duty cycle at the PWM comparator 88 to increase, thus increasing the magnitude of the output voltage. Also, if the output voltage is too high, the control voltage will be lower and the duty cycle will decrease. Ideally, the output of the error amplifier will be such as to produce approximately a 50% duty cycle so that the output voltage tracks the input voltage by the desired ratio of ½. The impedance Z is such that the output voltage is frequency compensated to react to transient conditions. This impedance allows the error amplifier to not be too much faster than the power circuit response causing oscillations or too slow for causing it to not correct fast enough for transient conditions. This allows the system to be calibrated to the desired ratio such as 50% of the input voltage and to maintain this ratio within approximately 1% from full load operation to no load operation.

A more detailed explanation of the operation is presented below.

The output voltage $V_{OUT}$ is controlled by the duty cycle of the PWM. As this duty cycle increases, $V_{OUT}$ increases up to the point where the duty cycle of PWM OUT approaches 100% which, in turn, causes $V_{OUT}$ to approach 100% of $V_{IN}$.

Assume the positive input of amplifier 72 has a fixed value of 2.5V. (For now ignore that this voltage is generated from a voltage division of V IN). When the circuit is first turned on, assume the following steady state conditions— $V_{IN}$ is 300V, PWM OUT is at 0% duty cycle, and $V_{OUT}$ is at 0 volts.

The resistor divider formed by resistors R5 and R6 forms the OUTPUT REFERENCE voltage which will be used to compare to the INPUT REFERENCE (2.5V) and adjust the output $V_C$ of the error amplifier 72 accordingly.

For the first cycle of AM CARRIER IN, a ramp voltage is applied to the PWM comparator 88 (assume this voltage is 2.5V peak). Since $V_{OUT}$ is at 0 volts, the OUTPUT REFERENCE is also at 0 volts. The output of amplifier 72, PWM REFERENCE, is at its full scale (call it 2.5V maximum). This causes the PWM OUT signal to be near 100% duty cycle.

The transistors Q1 and Q2 will turn on causing the current to flow through L1 and C3. The voltage across C3 will immediately begin to rise. As V OUT voltage rises, the OUTPUT REFERENCE voltage rises. This process may take several carrier cycles to evolve depending upon the time constant of L1, C3, the loading on the power supply, and the carrier frequency.

At some point, the output voltage $V_{OUT}$ will reach a point where the OUTPUT REFERENCE will approach the INPUT REFERENCE. As these voltages converge the PWM REFERENCE voltage will begin to decrease to the point that the OUTPUT REFERENCE will be equal to the INPUT REFERENCE. The PWM Reference will then vary slightly around the point were the OUTPUT REFERENCE and the INPUT REFERENCE are equal. As it goes higher, the OUTPUT REFERENCE will go above the INPUT REFERENCE, causing the PWM REFERENCE to reverse direction and go lower until the point that the INPUT REFERENCE will be higher than the OUTPUT REFERENCE and again change direction and go higher. The complex impedance Z will determine the frequency response and hysteresis of this loop.

To adjust the output voltage $V_{OUT}$, the voltage divider scale is set such that at the desired $V_{OUT}$ the voltage across R6 is equal to 2.5V (the level of the fixed reference). One problem with using a fixed reference is any change in the input voltage will not have any change on the output since the output is biased on a fixed reference. In normal power supply design this is very desirable.

In the present implementation another variable is added. Preferably $V_{OUT}$ is not some fixed voltage determined by a fixed reference of 2.5V. $V_{OUT}$ should track any variation in the input voltage $V_{IN}$. To accomplish this, the fixed INPUT REFERENCE voltage of 2.5V is changed to actually be a voltage division of $V_{IN}$.

In this case, say at a nominal voltage of 300V, the voltage divider R3 and R4 is set such that the voltage across R4 is 2.5V. If $V_{OUT}$ is set such that the voltage across R6 is 2.5V when $V_{OUT}$ is 150V, the circuit will then maintain the INPUT REFERENCE and OUTPUT REFERENCE to be equal. Since these voltage dividers are scaled, the output will be 150V output for 300V input.

As the input changes to from 300V to 270V, this will cause out INPUT reference to change from 2.5V to 2.25V. As soon as the INPUT REFERENCE drops, the OUTPUT REFERENCE is higher than the INPUT REFERENCE causing the output of amplifier 72 to decrease to the point the INPUT REFERENCE and OUTPUT REFERENCE are once again equal. This causes the OUTPUT REFERENCE to equal 2.25V equating to an output voltage of 135V which produces an output voltage exactly half the input. The duty cycle will vary little during this transition since as $V_{IN}$ dropped, $V_{OUT}$ will automatically decrease since it is based on $V_{IN}$ times the PWM duty cycle.

On the other hand, if a fixed reference of 2.5V is used, then as $V_{IN}$ drops, $V_{OUT}$ would try to drop, but the duty cycle will then increase above 50% to maintain the OUTPUT REFERENCE (2.5V=150V) equal to the fixed reference of 2.5V.

A case may be made to just fix the duty cycle to 50% and always let $V_{OUT}$ track to be 50% of $V_{IN}$. This works well when the system is loaded heavily, but there is an operating mode where there is little or no load on the output of the power supply. In this case capacitor C3 does not get discharged quickly enough and without any control can easily reach voltages of up to $V_{IN}$. (This is a problem with all switching power supply designs.) With the addition of the control loop, as the power supply is unloaded, and $V_{OUT}$ begins to rise the control circuit will automatically reduce the duty cycle to maintain a desired $V_{OUT}$.

In the case of the binary power supply, the supply can go from a fully loaded condition to a low or no load condition within several carrier cycles (approximately 2 microseconds). With this kind of constantly varying load, the control loop is desirable.

Figure 6:
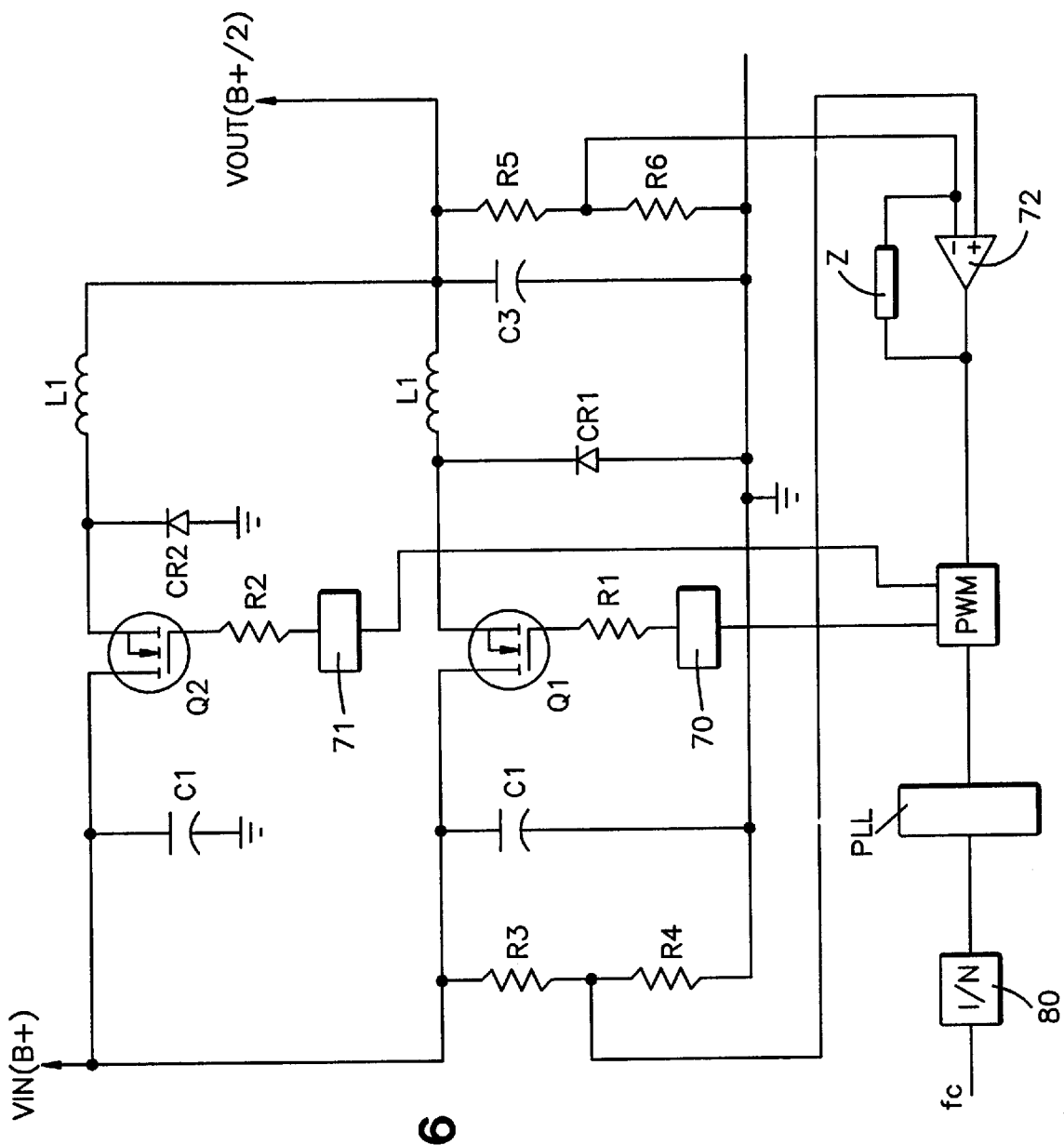

Reference is now made to FIG. 6 which illustrates another embodiment of the invention. This embodiment is similar to that as illustrated in FIG. 4 and consequently like components are described herein with like character references.

This embodiment employs a pair of drives 70 and 71 for driving MOSFET transistors Q1 and Q2 at 180 degrees out of phase with respect to each other. This provides a polyphase operation. The output filter capacitors would have near zero ripple current and the effective frequency ripple would be two times the operating frequency. This embodiment requires the addition of a second inductor L2, but the symmetry used in the switching of the two transistors may result in the elimination of the automatic gain control circuit AGC and the peak detector circuit described before.

Although the invention has been described in conjunction with the preferred embodiments, it is to be appreciated that various modifications may be made without departing from the spirit and scope of the invention as defined by the appended claims.

Having described the invention we claim:

1. An RF power amplifier system, comprising a DC voltage source for providing an input DC voltage; an RF source for providing an RF carrier signal; an RF amplifier for amplifying said carrier signal; a DC to DC power supply for supplying operating voltage to said RF amplifier wherein said operating voltage exhibits a desired percentage of said input voltage, said supply comprising:

a low pass filter including a capacitor;

a switching device periodically turned on by turn on pulses for periodically applying said input voltage to said filter to provide an output voltage across said capacitor;

a pulse generator for providing said turn on pulses at a frequency synchronized to the frequency of said carrier signal and exhibiting a duty cycle that varies as a function of the value of a control signal; and, a comparator that compares said input voltage with said output voltage and provides said control signal with a value that varies as a function of said comparison.

2. A system as set forth in claim 1 wherein said switching device is a switching transistor.

3. A system as set forth in claim 2 wherein said switching transistor is a MOSFET transistor.

4. A system as set forth in claim 1 wherein said switching device is a pair of MOSFET transistors connecting together in parallel.

5. A system as set forth in claim 1 wherein said filter includes an inductor and said capacitor.

6. A system as set forth in claim 5 wherein said switching device is a switching transistor.

7. A system as set forth in claim 6 wherein said switching device is a MOSFET transistor.

8. A system as set forth in claim 5 wherein said switching device is a pair of MOSFET transistors connected together in parallel.

9. A system as set forth in claim 1 wherein said pulse generator is a pulse width modulator having a pulse frequency that is synchronized to the frequency of said RF carrier signal.

10. A system as set forth in claim 9 wherein said switching device is a switching transistor.

11. A system as set forth in claim 10 wherein said switching transistor is a MOSFET transistor.

12. A system as set forth in claim 9 wherein said switching device is a pair of MOSFET transistors connected together in parallel.

13. A system as set forth in claim 12 wherein said filter includes an inductor and said capacitor.

14. A system as set forth in claim 1 wherein said comparator compares said input and output voltages such that said control signal represents the voltage difference between said input and output voltages.

15. A system as set forth in claim 14 wherein said switching device is a switching transistor.

16. A system as set forth in claim 15 wherein said switching transistor is a MOSFET transistor.

17. A system as set forth in claim 14 wherein said switching device is a pair of MOSFET transistors connected together in parallel.

18. A system as set forth in claim 17 wherein said filter includes an inductor and said capacitor.

19. A system as set forth in claim 18 wherein said pulse generator is pulse width modulator having a pulse frequency that is synchronized to the frequency of said RF carrier signal.

* * * * *